(12) United States Patent
Chan et al.

(10) Patent No.: US 8,231,423 B2
(45) Date of Patent: Jul. 31, 2012

(54) ORGANIC LIGHT-EMITTING DEVICE AND METHOD FOR FORMING THE SAME

(75) Inventors: Chuan-Yi Chan, Taipei (TW); Du-Zen Peng, Jhubei (TW); Po-Kun Su, Taipei (TW); Ryuji Nishikawa, Hsinshu (TW)

(73) Assignee: Chimei Innolux Corporation, Miao-Li County (TW)

( * ) Notice: Subject to any disclaimer, the term of this patent is extended or adjusted under 35 U.S.C. 154(b) by 472 days.

(21) Appl. No.: 12/348,133

(22) Filed: Jan. 2, 2009

(65) Prior Publication Data

US 2009/0174322 A1 Jul. 9, 2009

(30) Foreign Application Priority Data

Jan. 4, 2008 (TW) .............................. 97100391 A

(51) Int. Cl.
*H01J 1/62* (2006.01)
(52) U.S. Cl. ..................... 445/24; 313/504; 313/506
(58) Field of Classification Search ............... 445/24; 313/498–512
See application file for complete search history.

(56) References Cited

U.S. PATENT DOCUMENTS

| 6,720,203 | B2 * | 4/2004 | Carcia et al. ................. 438/99 |
| 7,030,552 | B2 * | 4/2006 | Chao et al. ................... 313/504 |
| 2004/0070808 | A1 * | 4/2004 | Nakanishi ................... 359/245 |
| 2006/0088951 | A1 * | 4/2006 | Hayashi et al. .............. 438/99 |
| 2007/0159089 | A1 * | 7/2007 | Oh et al. ..................... 313/506 |
| 2010/0244005 | A1 * | 9/2010 | Gyoda ......................... 257/40 |

* cited by examiner

*Primary Examiner* — Peter Macchiarolo
(74) *Attorney, Agent, or Firm* — Morris, Manning & Martin LLP; Tim Tingkang Xia Esq.

(57) ABSTRACT

An organic light-emitting device and a method for forming the same are provided. The organic light-emitting device includes: a substrate including a pixel area and a peripheral circuit area; a passivation layer on the substrate, the passivation layer including a first part in the pixel area and a second part in the peripheral circuit area; a pixel definition layer defining a plurality of pixel openings corresponding to the pixel area of the substrate; a plurality of first electrodes in the pixel openings; an adhesion layer on the second part; an organic layer on the first electrodes; and a second electrode layer on the organic light emitting layer, wherein the second electrode extends to the peripheral circuit area to connect with the adhesion layer.

9 Claims, 9 Drawing Sheets

ORGANIC LIGHT-EMITTING DEVICE AND METHOD FOR FORMING THE SAME

CROSS REFERENCE TO RELATED APPLICATIONS

This application claims the right of priority based on Taiwan Patent Application No. 097100391 entitled "organic light-emitting device and method of forming the same", filed on Jan. 4, 2008, which is incorporated herein by reference and assigned to the assignee herein.

FIELD OF THE INVENTION

This invention relates to an organic light-emitting device, and more particularly, to an organic light-emitting device for protecting against external moisture and a method of forming the same.

BACKGROUND OF THE INVENTION

Organic light-emitting diode (OLED) devices, also referred to as organic electroluminescent (EL) devices, have numerous well known advantages over other flat-panel display devices currently in the market place. Applications of OLED devices include active matrix image displays, passive matrix image displays, etc. Without considering particular OLED device configurations tailored to these broad fields of applications, all OLEDs function on the same general principles. An organic electroluminescent (EL) medium structure is sandwiched between two electrodes. In general, one of those two electrodes is light transmissive. When an electric potential is applied between the electrodes so that the anode is connected to the positive terminal of a voltage source and the cathode is connected to the negative terminal thereof, positive charge carriers (holes) are injected from the anode into the organic EL medium structure, and negative charge carriers (electrons) are injected from the cathode. Such charge carrier injection causes current to flow from the electrodes through the organic EL medium structure. Recombination of holes and electrons within a zone of the EL medium structure results in emission of light from this zone.

OLED devices have advantages of self-luminescence, wide viewing angle, high response speed, good color saturation and smooth appearance, etc. Despite their advantages, unprotected OLED display devices are prone to rapid degradation of performance due to adverse effects of oxygen and/or moisture present in the ambient environment. So far, there are two methods for overcoming the effects. One is to form a protective layer on the outer surface of the OLED by using a deposition method for avoiding oxygen or moisture infiltration, and the other is to provide a getter to the OLED for adsorbing moisture. However, these methods can cause additional processes and production cost, and can even reduce the luminous efficiency due to the shielding effect of the protective layer. Therefore, there may be issues of moisture infiltration and incompatibility with some OLEDs.

Thus, it is desired to have an organic light-emitting device which can reduce the moisture infiltration without implementing additional processes.

SUMMARY OF THE INVENTION

One aspect of the present invention is to provide an organic light-emitting device without degrading light-emitting efficiency and implementing additional processes, thereby avoiding moisture infiltration and increasing the operational lifetime thereof.

In an embodiment of the present invention, a method for forming an organic light-emitting device is provided. The method comprises providing a substrate having a pixel area and a peripheral circuit area; forming a passivation layer on the substrate, the passivation layer having a first part in the pixel area and a second part in the peripheral circuit area; forming a pixel definition layer on the first part, the pixel definition layer defining a plurality of pixel openings; forming a plurality of first electrodes in the pixel openings; forming an adhesion layer on the second part; forming an organic light emitting layer on the first electrodes; and forming a second electrode layer on the organic light emitting layer, the second electrode layer extending to the peripheral circuit area to connect with the adhesion layer.

In another embodiment of the present invention, an organic light-emitting device is provided. The organic light-emitting device comprises a substrate having a pixel area and a peripheral circuit area; a passivation layer on the substrate, the passivation layer having a first part in the pixel area and a second part in the peripheral circuit area; a pixel definition layer on the first part, the pixel definition layer defining a plurality of pixel openings; a plurality of first electrodes in the pixel openings; an adhesion layer on the second part of the passivation layer; an organic light emitting layer on the first electrodes; and a second electrode layer on the organic light emitting layer, the second electrode layer extending to the peripheral circuit area to connect with the adhesion layer.

Additionally, in another embodiment of the present invention, an electronic device is provided. The electronic device comprises an image display system. The image display system comprises an organic light-emitting device as recited in the above embodiment, and an input unit coupled to the organic light-emitting device and configured to provide a signal controlling the organic light-emitting device to display image.

DETAILED DESCRIPTION OF THE INVENTION

The drawings are provided for illustrative purposes only and, as such, they are not drawn to scale. The invention itself, however, in terms of both organization and method of operation, may best be understood by reference to the detailed description which follows taken in conjunction with the accompanying drawings. In the embodiments of the present invention, the same or like reference numbers will be used throughout the drawings to refer to the same or like parts.

FIGS. 1-7 are cross-sectional views of organic light-emitting devices in accordance with an embodiment of the present invention.

Figure 1:
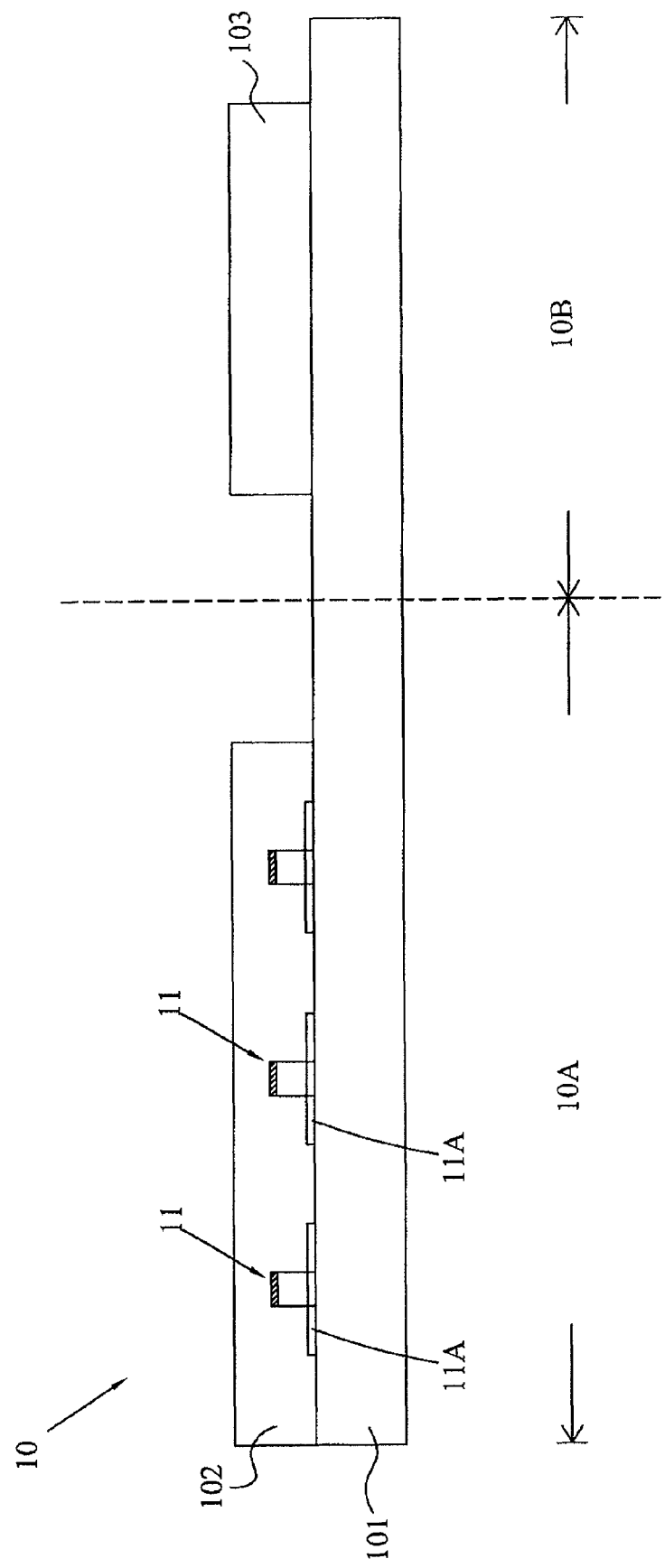
FIGS. 1 to 7 are cross-sectional views illustrating the steps of forming an organic-light emitting device in accordance with an embodiment of the present invention.

Referring to FIG. 1, a substrate 10 has a glass substrate 101, a dielectric layer 102 and a circuit layer 103. The substrate 10 can also be divided into a pixel area 10A and a peripheral circuit area 10B. For example, the pixel area 10A generally is the center region of a display panel for displaying information, and the peripheral circuit area 10B generally is the edge region of the display panel configured with the control/driving circuits. A transistor 11, on which the dielectric layer 102 is formed, is formed in the pixel area 10A and includes a device electrode layer 11A (such as source/drain regions). The transistor 11 formed in the pixel area 10A is used to control the pixels. Besides, a signal electrode layer and a peripheral circuit system (including the transistors required for the peripheral circuit) can be formed within the circuit layer 103 in the peripheral circuit area 10B. The peripheral circuit area 10B and the pixel area 10A may have different electrical functions depending on different design requirements.

Figure 2:
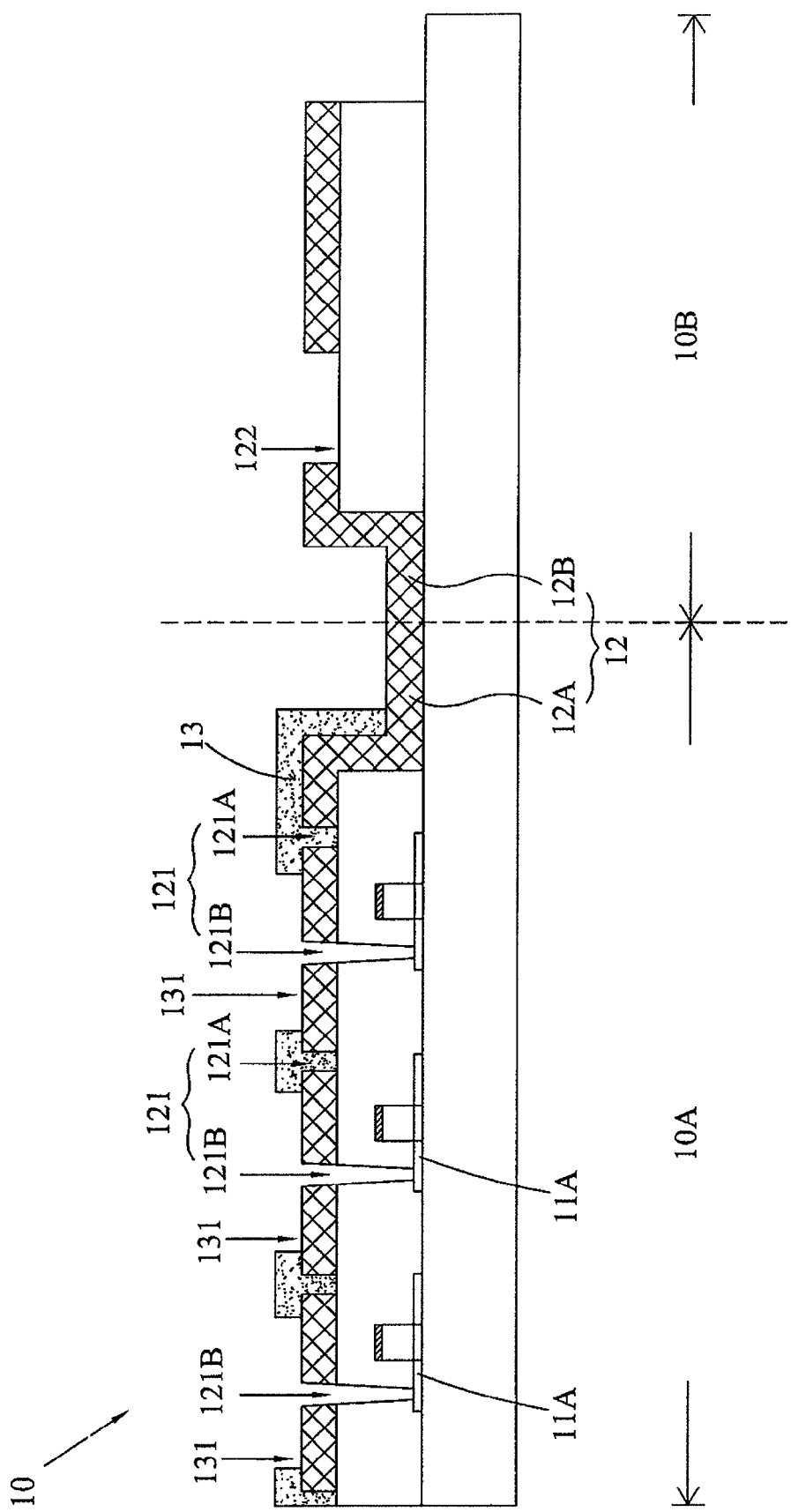

In FIG. 2, a passivation layer 12 is formed on the substrate 10, in which the passivation layer 12 has a first part 12A defining a plurality of openings 121 in the pixel area 10A. Meanwhile a second part 12B defines a contact opening 122 in the peripheral circuit area 10B. For example, the passivation layer 12 can be a dielectric protective layer formed by means of conformal deposition. Then, by using patterning technology (including lithography and etching), the openings 121 are formed in the pixel area 10A and the contact opening 122 is formed in the peripheral circuit area 10B. The openings 121 formed in the pixel area 10A can include an opening 121A (described below in more detail) in a pixel definition layer 13 formed subsequently and/or an electrode opening 121B corresponding to a device electrode layer 11A. The contact opening 122 formed in the peripheral circuit area 10B may serve as a point of electrical contact between a second electrode layer 18 formed hereafter (referring to FIG. 5) and the peripheral circuit.

The pixel definition layer 13 is formed on the pixel area 10A, for example on part of the first part 12A and in the opening 121A. A plurality of pixel openings 131 corresponding to the electrode openings 121B are defined by the pixel definition layer 13 to avoid shorts among the pixels. Note that the electrode opening 121B exposes the device electrode layer 11A, to facilitate the first electrodes 14 formed hereafter (referring to FIG. 3) in electrically contacting with the device electrode layer 11A (such as source/drain regions). In this embodiment, the pixel definition layer 13 is generally formed by inorganic or organic dielectric material, such as, but not limited to, silicon oxide or polyimide.

Figure 3:
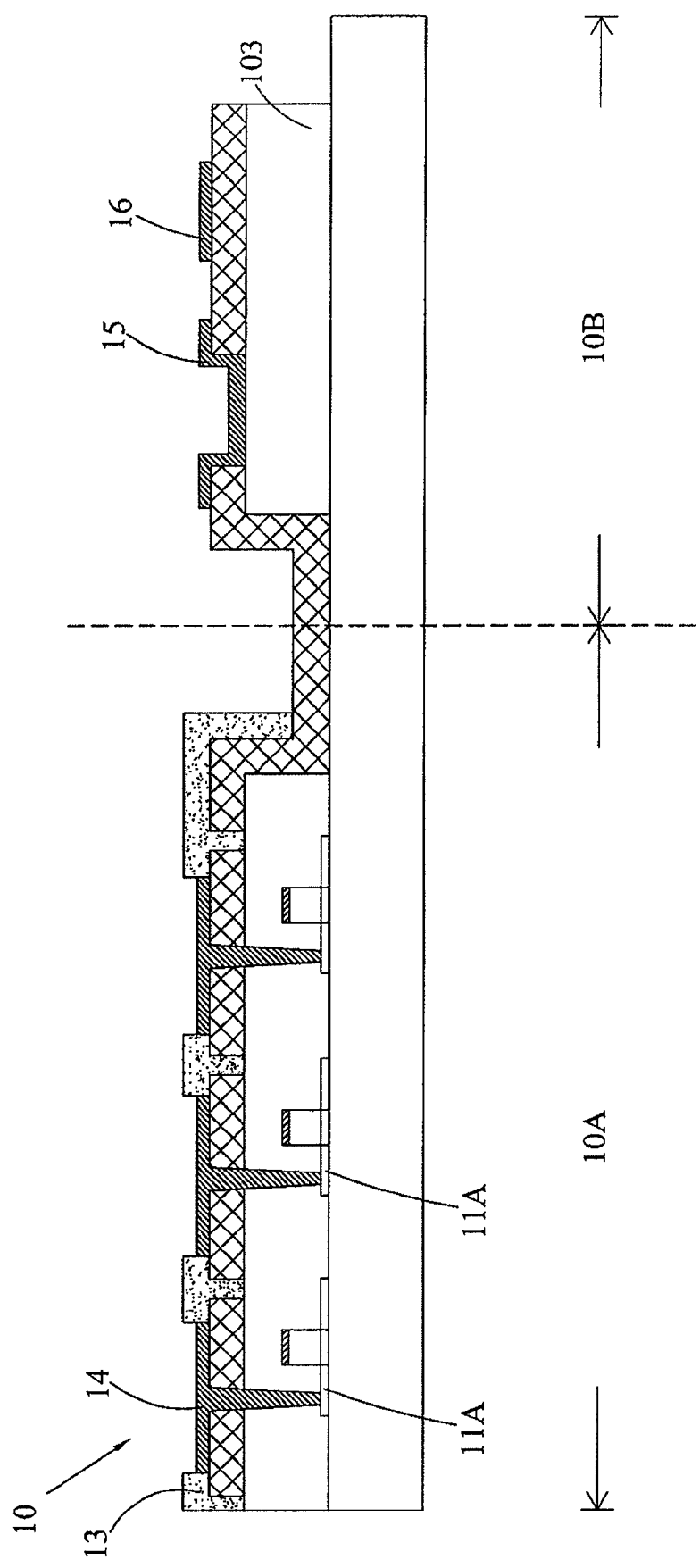

Referring to FIG. 2 and FIG. 3, a plurality of first electrodes 14 are formed in the plurality of pixel openings 131 and the electrode openings 121B. In the embodiment, the first electrodes 14 can be formed by, for example, but not limited to, physical vapor deposition, sputtering deposition, plasma enhanced chemical vapor deposition (PECVD), or electron-beam assisted vapor deposition. Referring to FIG. 3, the first electrodes 14 are electrically contacted with the device electrode layer 11A in the transistor 11, and an adhesion layer 16 is formed on the second part 12B of the passivation layer 12.

Selectively, in the peripheral circuit area 10B, a conductive layer 15 is further formed in the contact opening 122 for enhancing electrical contact between a second electrode layer 18 (referring to FIG. 5) and a circuit layer 103. In the embodiment, the forming of the first electrodes 14 and the adhesion layer 16 is performed in a simultaneous process. More preferably, the forming of the first electrodes 14, the adhesion layer 16, and the conductive layer 15 is performed simultaneously.

In the process of forming the first electrodes 14 and the adhesion layer 16, the adhesion layer 16 is, but not limited to, a floating type patterned layer. In the subsequent process of forming the second electrode layer 18, the adhesion layer 16 is connected with the second electrode layer 18 In addition, the patterned adhesion layer 16 forms a sealing layer surrounding the pixel area 10A for sealing the circuit devices within an organic light-emitting device 100 (referring to FIG. 7), hence protecting against external moisture or oxygen. The pattern for the adhesion layer 16 will be further illustrated in FIG. 8.

Note that the first electrodes 14 and the adhesion layer 16 preferably use the same material, such as indium tin oxide (ITO), indium zinc oxide (IZO) or zinc oxide (ZnO), and are formed in the same process, so that the step of forming the adhesion layer can be integrated into the present process only by modifying the mask design of the first electrodes 14. Moreover, the steps of forming the first electrodes 14 and the adhesion layer 16 may be performed separately, and the adhesion layer 16 may include a material which is the same as that included in second electrode layer 18 formed hereafter, such as ITO, IZO, ZnO and so forth, so as to increase adhesion thereof to the second electrode layer 18. However, those skilled in the art shall understand that the material may be of a different type or one with similar chemical characteristic.

Figure 4:
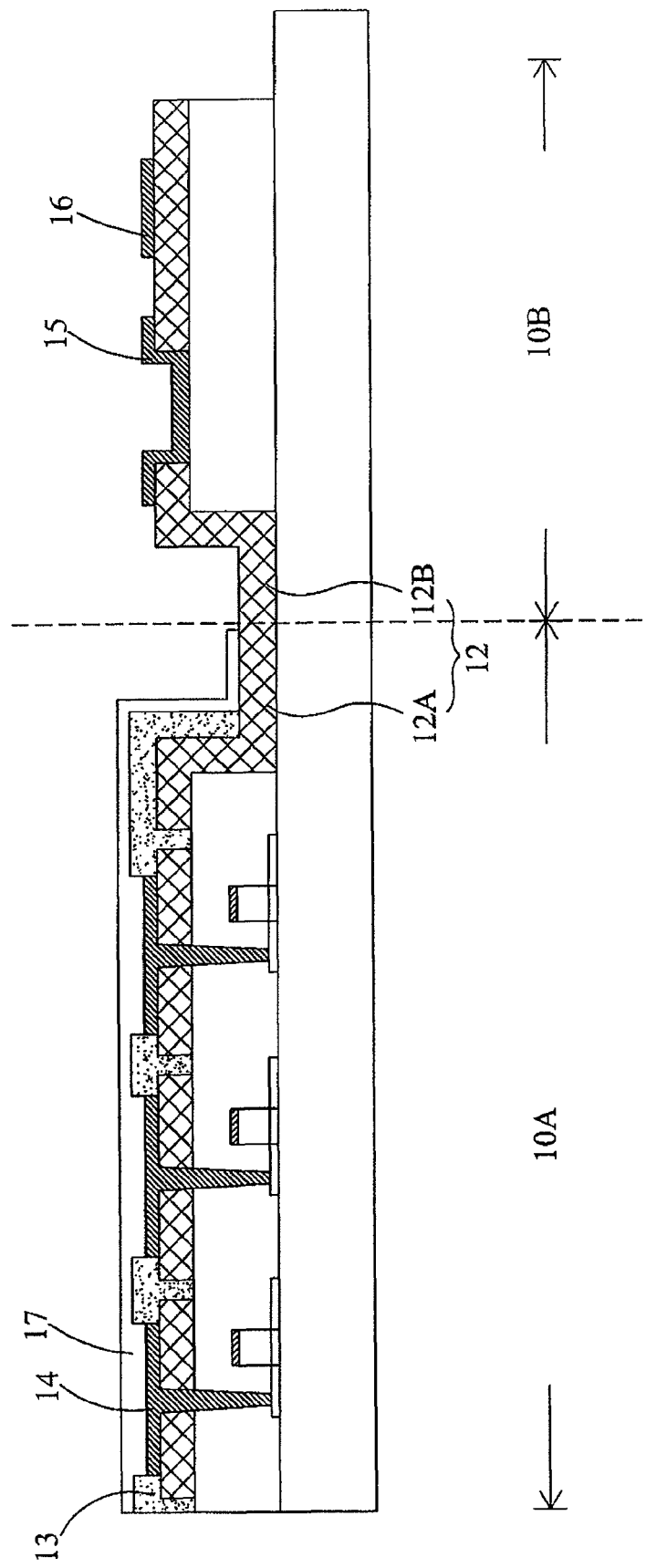

As shown in FIG. 4, an organic light emitting layer 17 is formed on the first electrodes 14. In this embodiment, the organic light emitting layer 17 is formed on the first electrodes 14 in the pixel area 10A as a light-emitting layer of the organic light-emitting device. The organic light emitting layer 17 can be formed by using conventional light-emitting materials and be a stack structure including, for example, an electric hole transport layer, a luminescence layer, and an electron transport layer, all of which well known in the art.

Figure 5:
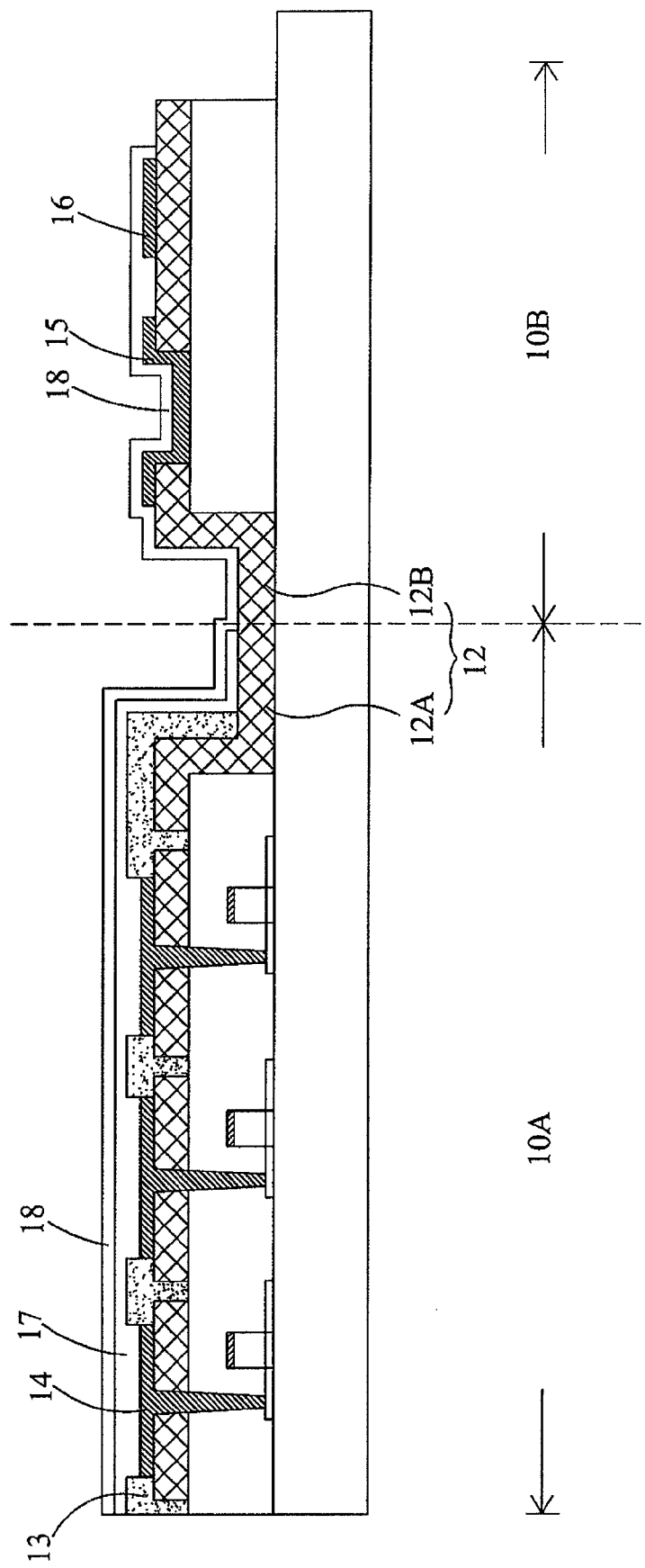

In FIG. 5, a second electrode layer 18 is formed on the organic light emitting layer 17. The second electrode layer 18 is extended to the peripheral circuit area 10B to connect with the conductive layer 15 and then to further connect with the adhesion layer 16. Note that the second electrode layer 18 and the adhesion layer 16 can each have a stack structure. The stack structure of the adhesion layer 16 can include, for example, a transparent conductive layer (such as ITO, IZO and ZnO) and metals (such as Al, Ag or Au) or alloys thereof. For example, the layering of the stack structure may be transparent conductive layer/metals or transparent conductive layer/metals/transparent conductive layer. The second electrode layer 18 may be a stack structure of transparent conductive layers or a stack structure of transparent conductive layers plus thin metal layers. The thickness of the thin metal layer is less than 300 angstroms. Preferably, the interface layers between the adhesion layer 16 and the second electrode layer 18 are of a same material or a material with similar characteristic, such as ITO, IZO, ZnO and so forth, so as to increase adhesion between the second electrode layer 18 and the adhesion layer 16.

In this embodiment, the first electrodes 14 and the second electrode layer 18 can form a corresponding cathode-anode pair. Namely, when the first electrodes 14 together are designated as the anodes, the second electrode layer 18 is the cathode; on the contrary, when the first electrodes 14 are the cathodes, the second electrode layer 18 is the anode. In general, the anode of the organic light-emitting device is made of conductive materials having a relatively high work function, such as indium tin oxide (ITO) and indium zinc oxide (IZO), and the cathode is a conductive material having a relatively low work function, for example Au, Ag, Al, Cu or Cr or alloys thereof. In this embodiment, the first electrodes 14 are the anodes (such as ITO), whereas the second electrode layer 18 is the cathode.

Figure 6:
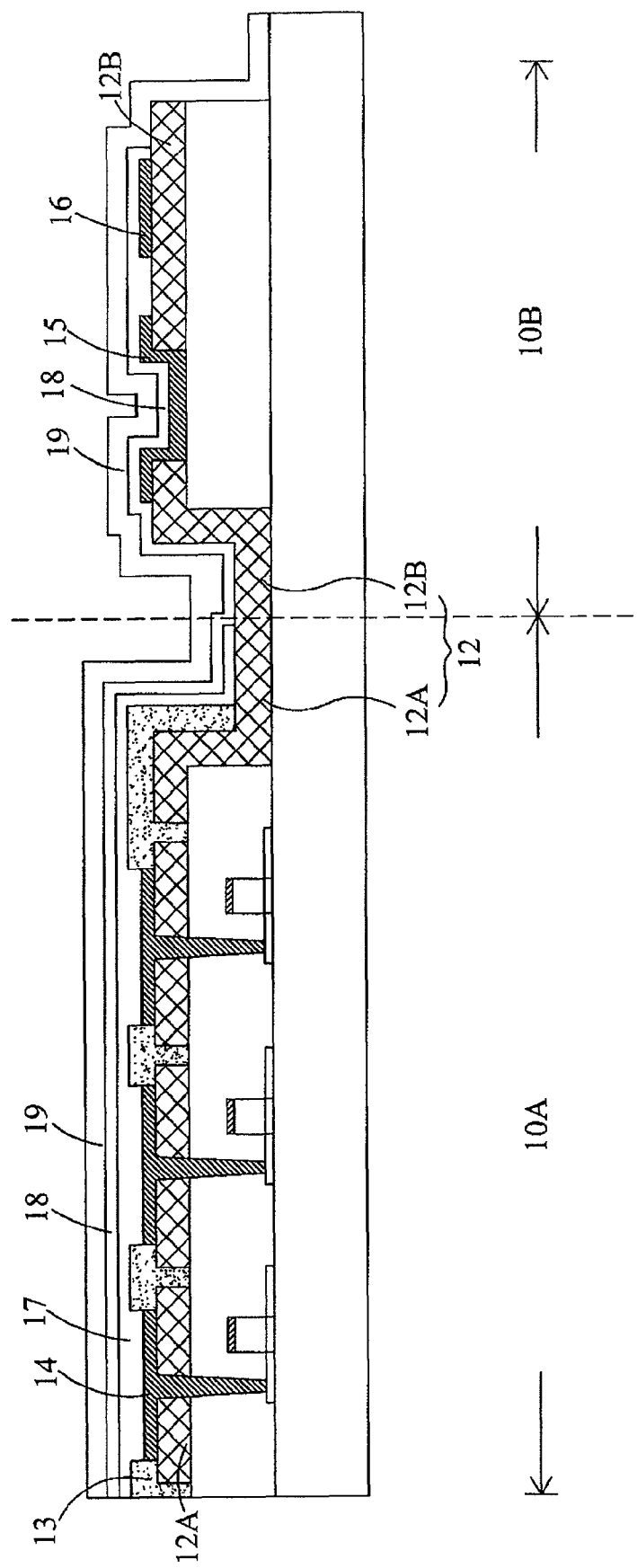

As shown in FIG. 6, selectively, a protective layer 19 is formed on the second electrode layer 18. In this embodiment, the protective layer 19 can be an inorganic protective layer, made of inorganic materials such as aluminum oxide, silicon dioxide, silicon nitride, silicon oxynitride and the likes, to further protect the organic light-emitting device from external moisture.

Figure 7:
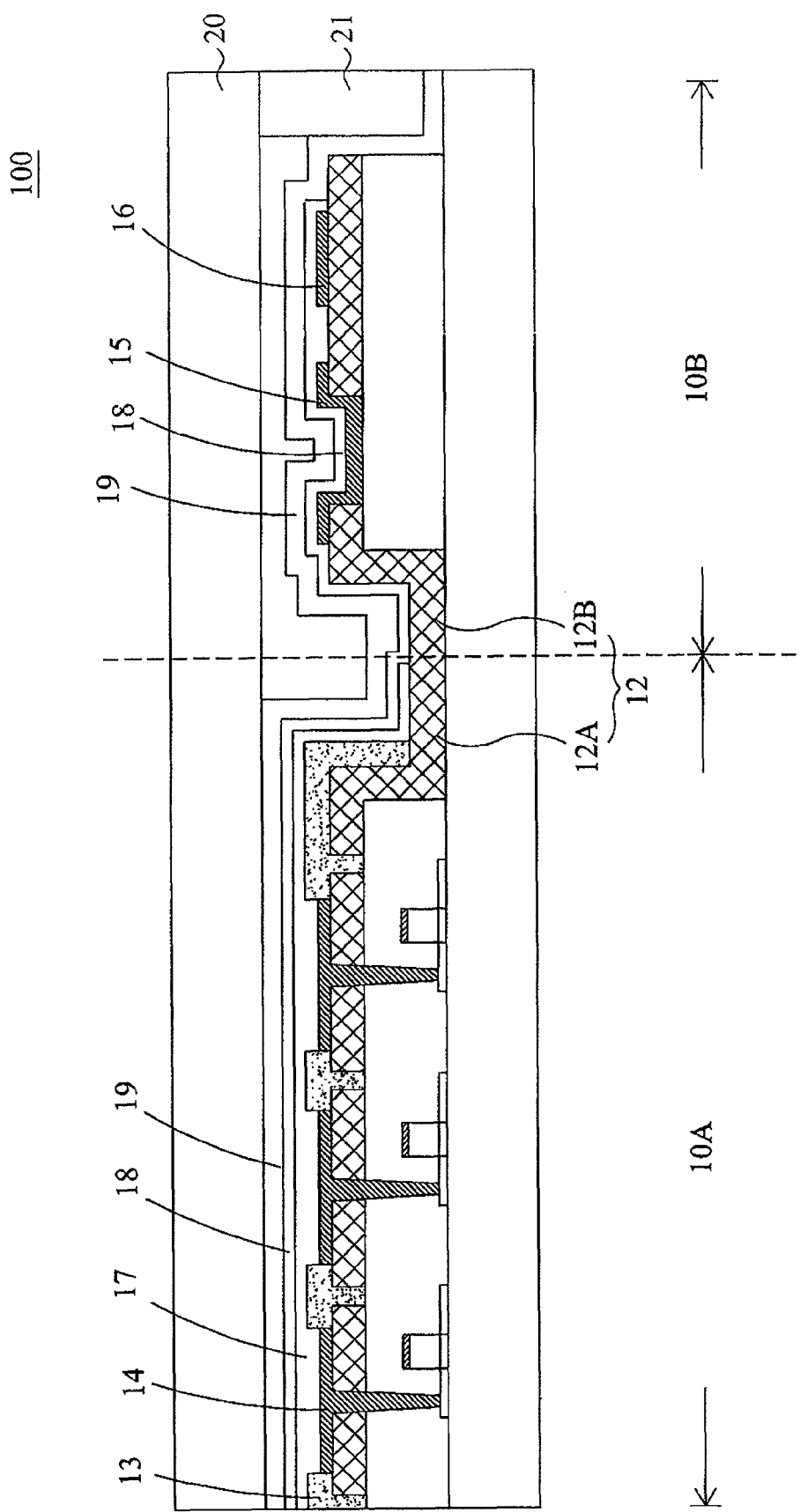

Referring to FIG. 7, a cover 20 is provided to form the organic light-emitting device 100, wherein a sealing material 21 is used for sealing. In this embodiment, the cover 20 can be a transparent glass or a color filter.

Figure 8:
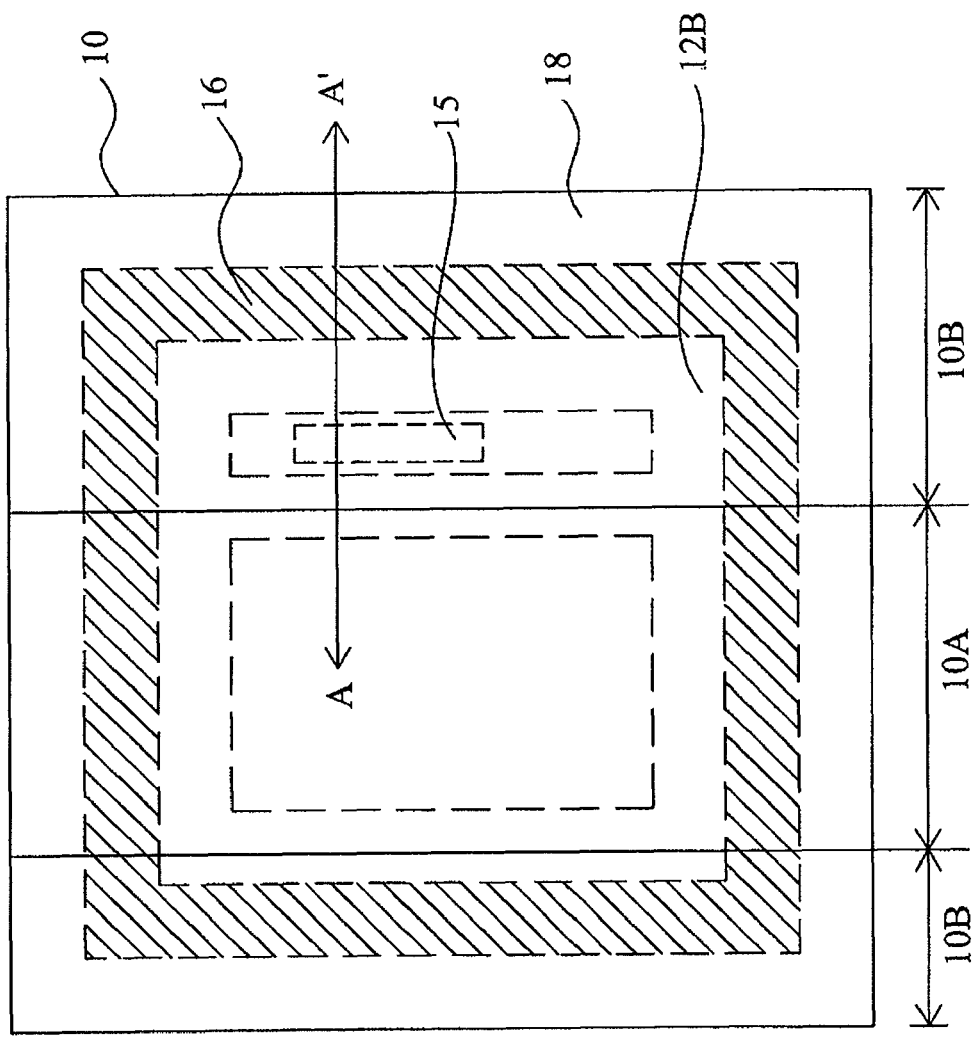
FIG. 8 is a top view of an organic-light emitting device in accordance with an embodiment of the present invention.

In this embodiment, the cross-sectional view of FIG. 5 is one taken along line A-A' of FIG. 8. The various components of the organic light-emitting device 100, which is formed according to the steps described above, are illustrated in FIG. 8, and thus are not to be deliberated in details hereinafter. However, the drawings are provided for illustrative purposes only and, as such, post no limitations.

FIG. 8 is a top view of the organic light-emitting device 100 in accordance with an embodiment of the present invention. As shown in FIG. 8, the second electrode layer 18 is located at the top of the organic light-emitting device 100, and distributed on both the pixel area 10A and the peripheral circuit area 10B. In the peripheral circuit area 10B, there are the adhesion layer 16, the conductive layer 15, the second part 12B of the passivation layer 12, and the substrate 10 (including related peripheral circuits or devices) all below the second electrode layer 18. The vertical order of the foregoing layers is shown in FIG. 5. Therefore, the adhesion layer 16 is electrically floated with the second electrode layer 18 and forms a sealing layer surrounding the pixel area 10A and/or related devices of the peripheral circuit area 10B.

The layer 16 may be patterned to have a rectangle shape, but not limited to such shape, along the peripheral circuit area 10B for protecting against external moisture. However, the layer 16 may be patterned to have a different shape to enclose the pixel area 10A and/or related devices of the peripheral circuit area 10B in a manner within the scope of the present invention. Accordingly, the present invention is to provide an organic light-emitting device without changing light-emitting efficiency, or implementing additional processes, so as to protect against external moisture or oxygen permeation, thereby increasing the operational lifetime thereof.

Figure 9:
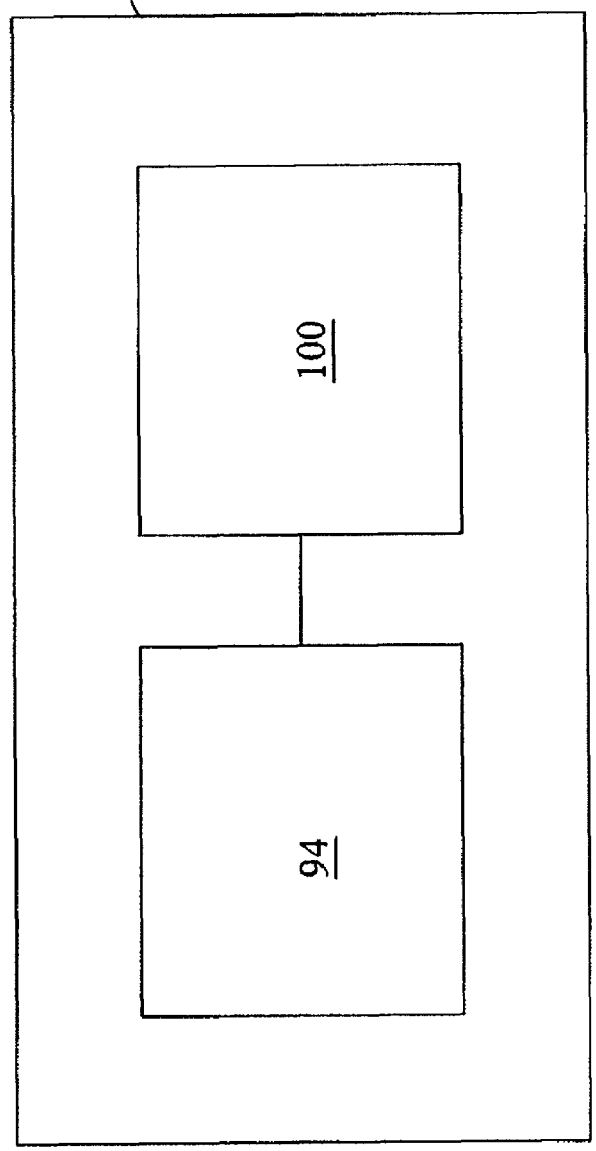
FIG. 9 is a schematic illustration of an electronic device in accordance with another embodiment of the present invention.

FIG. 9 is a schematic diagram illustrating an electronic device 90 in accordance with an embodiment of the present invention. In FIG. 9, the electronic device 90 incorporates an image display system 92, which includes an organic light-emitting device 100 and an input unit 94. For example, the electronic device 90 may be a cellular phone, a digital camera, a personal digital assistant (PDA), a notebook a computer, a desktop computer, a television, an automobile display, an aircraft display, a global positioning system (GPS) or a portable DVD player, etc. The organic light-emitting device may be an organic light-emitting device 100 disclosed in the foregoing embodiments or the likes. In this embodiment, the illustration is based on the organic light-emitting device 100. Moreover, the input unit 94 is coupled to the organic light-emitting device 100, and configured to provide signals controlling the organic light-emitting device 100 to display image.

It will be apparent to those skilled in the art with regard to this disclosure that other modifications of this invention beyond those embodiments specifically described here may be made without departing from the spirit of the invention. Accordingly, such modifications are considered within the scope of the invention as limited solely by the appended claims.

The invention claimed is:

1. A method for forming an organic light-emitting device, comprising:
    providing a substrate having a pixel area and a peripheral circuit area;
    forming a passivation layer on said substrate, said passivation layer having a first part in said pixel area and a second part in said peripheral circuit area;
    forming a pixel definition layer on said first part, said pixel definition layer defining a plurality of pixel openings;
    forming a first electrode in a corresponding one of said pixel openings;
    forming an adhesion layer on said second part;
    forming an organic light emitting layer on said first electrode; and
    forming a second electrode layer on said organic light emitting layer, said second electrode layer extending to said peripheral circuit area to connect with said adhesion layer;
    wherein said adhesion layer includes a material having similar characteristic with one of said first electrode and said second electrode layer.

2. The method of claim 1, wherein said step of forming said first electrode and said step of forming said adhesion layer are performed simultaneously.

3. The method of claim 1, wherein said step of forming said first electrode and said step of forming said adhesion layer are performed separately.

4. The method of claim 1, wherein said step of forming said passivation layer further comprises a step of forming said second part to define a contact opening.

5. The method of claim 4, wherein said second electrode layer is electrically connected to a circuit layer on said peripheral circuit area through said contact opening.

6. The method of claim 4, further comprising a step of forming a conductive layer in said contact opening, said conductive layer electrically connecting to a circuit layer on said peripheral circuit area.

7. The method of claim 6, wherein said second electrode layer is formed on said conductive layer and electrically connected to said conductive layer.

8. The method of claim 1, further comprising a step of forming a protective layer on said second electrode layer.

9. The method of claim 1, wherein said adhesion layer is formed as a sealing layer surrounding said pixel area.

* * * * *